United States Patent [19]

Cahalan

[11] Patent Number: 5,309,294
[45] Date of Patent: May 3, 1994

[54] METHOD AND CIRCUITRY TO PROVIDE TRUE VOLTAGE BIAS TO A MAGNETORESISTIVE HEAD

[75] Inventor: Dennis J. Cahalan, Boulder, Colo.
[73] Assignee: Rocky Mountain Magnetics, Inc., Louisville, Colo.
[21] Appl. No.: 941,929
[22] Filed: Sep. 8, 1992
[51] Int. Cl.$^5$ .............................................. G11B 5/03
[52] U.S. Cl. ........................................ 360/66; 360/113
[58] Field of Search .................... 360/66, 67, 68, 113; 307/491; 324/20-21, 225, 252; 330/290, 296, 261

[56] References Cited

U.S. PATENT DOCUMENTS

| | | | |
|---|---|---|---|
| 3,745,478 | 7/1973 | Affinito | 330/261 |
| 3,979,399 | 8/1976 | Chadbourne | 330/9 |
| 4,290,023 | 9/1981 | Greenfield | 330/9 |
| 4,706,138 | 11/1987 | Jove et al. | 360/67 |
| 4,712,144 | 12/1987 | Klaassen | 360/113 |
| 4,743,861 | 5/1988 | Jove et al. | 330/260 |
| 4,786,993 | 11/1988 | Jove et al. | 360/67 |
| 4,914,398 | 4/1990 | Jove et al. | 328/167 |

OTHER PUBLICATIONS

K. B. Klaassen, "Magnetic Recording Channel Front-Ends", Pre-print for Nov. 1991 IEEE Trans. on Magnetics, 6 pages.
IBM Technical Disclosure Bulletin, vol. 26, No. 12 May 1984 pp. 6626–6628.

Primary Examiner—Donald Hajec
Assistant Examiner—Jhihan Clark
Attorney, Agent, or Firm—Albert P. Cefalo; Ronald C. Hudgens; Barry N. Young

[57] ABSTRACT

The present invention is directed to a circuit and method for nullifying a drop in the voltage across an MR head caused a parasitic cable resistance. The invention uses local modeling of the cable resistance in order to generate a nulling voltage, equal in magnitude to the voltage across the cable resistance. The magnitude of the nulling voltage is adjusted as the resistance of the MR head varies within a population of heads. The nulling voltage is added to the bias voltage, in order to negate the effect of the cable resistance.

12 Claims, 4 Drawing Sheets

METHOD AND CIRCUITRY TO PROVIDE TRUE VOLTAGE BIAS TO A MAGNETORESISTIVE HEAD

BACKGROUND OF INVENTION

1. Field of the Invention

The present invention relates generally to retrieval of magnetically stored data using a magnetoresistive (MR) head, and more particularly, to a circuit and method for providing a true voltage bias to an MR head.

2. Related Art

A Magnetoresistive (MR) head is commonly used to retrieve data stored on a magnetic medium, such as a disk drive. Data is read by detecting variations in the resistance of a sensor stripe of the MR head caused by variations in the magnetic field emanating from the storage medium. This resistance is represented by $R_{MR}$. $R_{MR}$ consists of a constant component $R_{dc}$ and variable component $R_{ac}$. $R_{ac}$ represents the change in resistance due to the fluctuating magnetic field. In order to detect variations in $R_{MR}$, a bias current is passed through the sensor stripe of the MR head. This bias current serves to convert variations in stripe resistance produced by the magnetic field into a voltage signal.

Existing MR head systems commonly bias the MR head with either a constant bias current or (to a lesser extent) a constant voltage. A differential voltage amplifier is commonly used to amplify the ac component $V_{ac}$ of the voltage signal across the MR head. Other detection methods involve measurement of the ac component $I_{ac}$ of the current signal through the MR head.

For constant current biasing, a constant current $I_{BIAS}$ is passed through the sensor stripe. For the voltage case, the ac voltage component is then $V_{ac} = I_{BIAS} R_{ac}$.

There are a number of problems associated with constant current biasing. These problems result from submicron dimensional variations of the head, which commonly occur among a given population of MR heads. Such dimensional variations result from imperfections in the fabrication process.

One such problem is related to the design of the sense amplifier and automatic gain control (AGC) section of the MR head system. Dimensional variations affect both $R_{ac}$ and $R_{dc}$ of the MR head. Since $V_{ac} = I_{BIAS} R_{ac}$, the amplitude of $V_{ac}$ is affected by these dimensional variations as well. Consequently, the amplifier/AGC section of an MR head system using a constant bias current must be designed for a voltage signal having a wide dynamic range.

A second problem is related to the current density in the MR head. Both the performance and the reliability of the MR head depend on the current density. When a constant bias current flows through the MR head, the current density depends on the cross-sectional area of the head. In order to maintain a high level of performance, it is desirable to maintain a high current density. A high current density results in a high read-back signal, and thus a high signal-to-noise ratio and a low error rate. However, if the current density is too high, the life of the MR head becomes limited as the result of electromigration, and the reliability rate decreases. Thus, there is a tradeoff between performance and reliability. Consequently, in order to achieve an acceptable balance between performance and reliability, it is important to maintain an "optimum" current density in the MR head.

Constant current biasing does not always permit the MR head to be biased with this optimum current density level. Cross-sectional area variations among a population of MR heads results in a wide distribution of current density variations. To achieve acceptable part reliability, a wide current density design tolerance must therefore be maintained, resulting in a lower mean current density, and lower performance.

The problems associated with constant current biasing discussed above can potentially be solved by biasing the MR head with a constant voltage, $V_{BIAS}$. The ac component of the voltage across the MR head is then $V_{ac} = (R_{ac}/R_{dc}) V_{BIAS}$. Since $R_{ac}$ and $R_{dc}$ are affected equally by dimensional variations, the effect of these resistance variations cancel. Thus, $V_{ac}$ is not affected by dimensional variations of the MR head, and the amplifier/AGC section of the MR system can have a narrower dymanic range tolerance.

Constant voltage biasing additionally provides the advantage of maintaining a constant current density through the MR head, independent of cross-sectional area variations. Thus, MR head systems utilizing a constant voltage biasing scheme can be designed with a narrower current density tolerance, and a higher mean current density. Such designs can achieve a higher level of performance without a corresponding decrease in part reliability.

Although constant voltage biasing provides considerable advantages over constant current biasing, the ability to adequately provide a constant voltage bias across the MR head is prevented by the existence of a parasitic resistance $R_c$ in the conductors of cables connecting the biasing circuit to the MR head. This cable resistance typically includes: 1) MR head-to-bonding pad trace resistance, 2) bonding pad-to-flex circuit mag wire resistance, 3) flex-circuit to IC resistance, and 4) parasitic resistances in the integrated circuit voltage biasing source. $R_c$ typically has a value of about 5 Ohms, in comparison to a typical $R_{MR}$ value of about 15 Ohms.

The addition of $R_C$ to the MR bias circuit creates a voltage divider circuit in which a portion of $V_{BIAS}$ falls across $R_c$. This prevents the full bias voltage $V_{BIAS}$ from being applied to the MR head. Further, as $R_{MR}$ varies within a population of heads, the portion of $V_{BIAS}$ which is applied to the MR head still vary due to the voltage divider effects of $R_C$. As a result, true constant voltage biasing is not achieved, and the advantages of constant voltage biasing are not fully realized.

What is needed is a means for providing a constant voltage bias to an MR head, wherein the effects of parasitic cable resistances are negated.

SUMMARY OF THE INVENTION

The present invention is directed to a circuit and method for nullifying a drop in the voltage across an MR head caused a parasitic cable resistance. The invention uses local modeling of the cable resistance in order to generate a nulling voltage, equal in magnitude to the voltage across the cable resistance. The magnitude of the nulling voltage is adjusted as the resistance of the MR head varies within a population of heads. The nulling voltage is added to the bias voltage, in order to negate the effect of the cable resistance.

BRIEF DESCRIPTION OF THE DRAWINGS

In the drawings, like reference numbers indicate identical or functionally similar elements.

DETAILED DESCRIPTION OF THE PREFERRED EMBODIMENT

The present invention is a method and circuit for providing a constant voltage bias to an MR head. This is accomplished by using a nulling circuit to adjust the output of a voltage biasing circuit. The nulling circuit effectively increases the output of the voltage biasing circuit by an amount approximately equal to the cable drop across any parasitic cable resistances which are present. The nulling circuit nulls the drop in the voltage across the MR head due to these parasitic resistances, providing a true voltage bias at the MR head.

Figure 1:
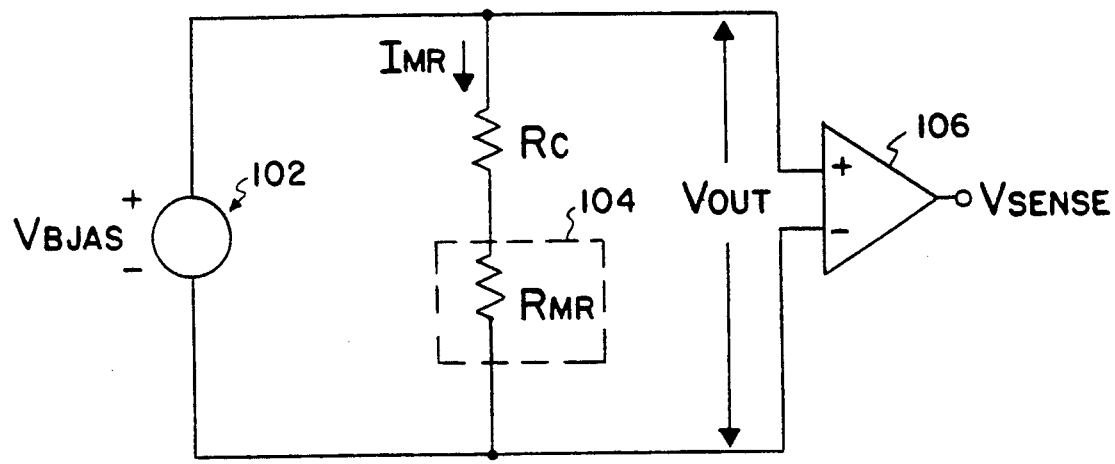
FIG. 1 is a simplified schematic diagram of a constant voltage biasing scheme for an MR head illustrating the effects of the parasitic cable resistance.

FIG. 1 is a simplified schematic diagram of a voltage biasing circuit, which illustrates the problem caused by the existence of a parasitic cable resistance. A bias voltage source 102 attempts to apply a constant voltage $V_{BIAS}$ to an MR head 104 having a resistance of $R_{MR}$. It is assumed that the bias voltage source 102 has an infinite ac impedance $Z_{ac}$, and a dc impedance $Z_{dc}$ of zero. A parasitic cable resistance $R_C$ is seen in series with $R_{MR}$. A current $I_{MR}$ flows through $R_c$ and $R_{MR}$. A differential voltage amplifier 106 detects the ac component of the output voltage, $V_{OUT}$, to produce a voltage signal $V_{SENSE}$. A current sense method of detecting the ac component of the current through the MR could be used instead of a voltage sense method. In the event that current sense is used, both $Z_{ac}$ and $Z_{dc}$ are zero.

A portion of $V_{BIAS}$ falls across $R_C$. This voltage falling across $R_C$ is referred to as the "cable drop." The effect of the cable drop is a decrease in the voltage across $R_{MR}$ below the desired voltage $V_{BIAS}$. As $R_{MR}$ varies within a population of heads, the cable drop varies. Thus, a constant voltage is not maintained across $R_{MR}$. As a result, the advantages of constant voltage biasing discussed above are not fully achieved.

Figure 2:
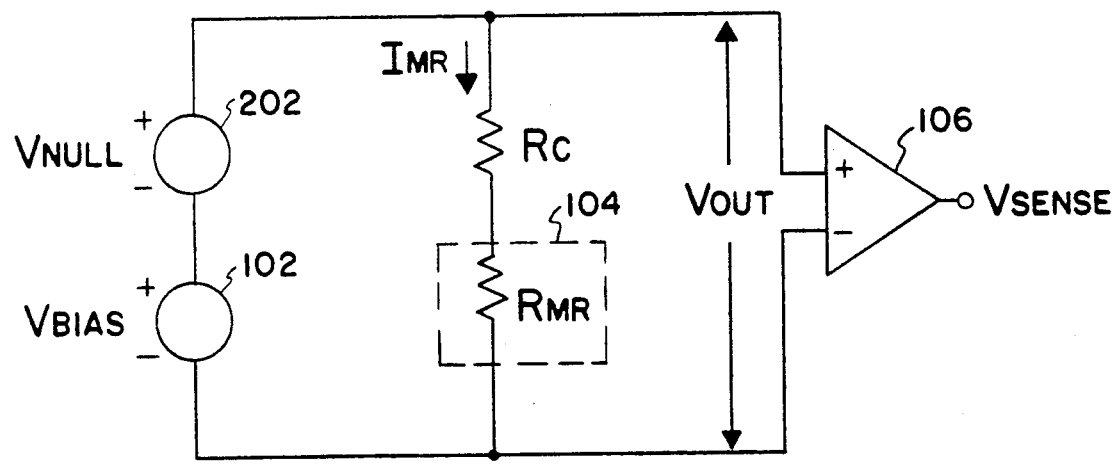
FIG. 2 is a simplified schematic diagram of a circuit for nullifying the effect of the cable drop.

FIG. 2 is a simplified schematic diagram illustrating the method of the invention for nullifying the effect of the cable drop. A nulling voltage source 202 is added to the circuit of FIG. 1, in series with the bias voltage source 102. The nulling voltage source 202 supplies a voltage $V_{NULL}$, which is added to $V_{BIAS}$. Typically, $V_{NULL}$ has the same impedance characteristics as $V_{BIAS}$.

The magnitude of $V_{NULL}$ is equal to the current $I_{MR}$ flowing through the MR head 104, multiplied by an estimate $R'_C$ of the cable resistance $R_c$. Thus, $V_{NULL} = I_{MR} R'_C \approx I_{MR} R_C$. Therefore, $V_{NULL}$ is an estimate of the cable drop, and serves to null the decrease in voltage across $R_{MR}$ due to the cable drop. The voltage across $R_{MR}$ remains constant at $V_{BIAS}$ independent of resistance variations within a population of heads, and the benefits of constant voltage biasing are achieved. As in FIG. 1, a current sense can be substituted for a voltage sense.

Figure 3:
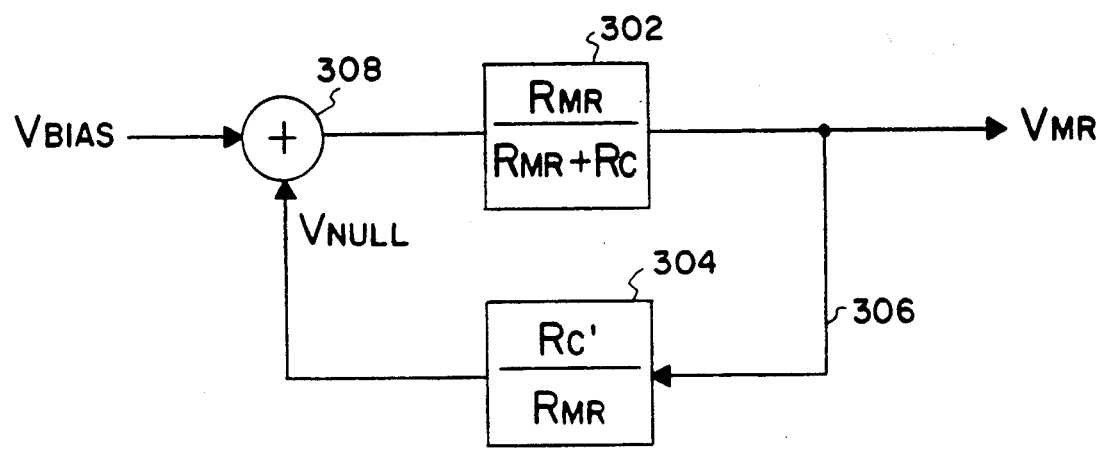
FIG. 3 is a feedback diagram for nullifying the effect of the cable drop.

FIG. 3 is a feedback diagram which illustrates the method discussed above for nullifying effect of the cable drop for the voltage sense case. A block 302 in the direct path of the feedback diagram represents the MR head 104 and the cable resistance $R_C$. The output of block 302, $V_{MR}$, represents the actual voltage across the MR head. A block 304 in the feedback path 306 represents a nulling circuit. The nulling circuit uses the estimated cable resistance $R'_C$ to generate the estimate $V_{NULL}$ of the portion of the cable drop. $V_{NULL}$ is then added to $V_{BIAS}$ by an adder 308 to offset or nullify the effect of the voltage across $R_C$.

Figure 4:
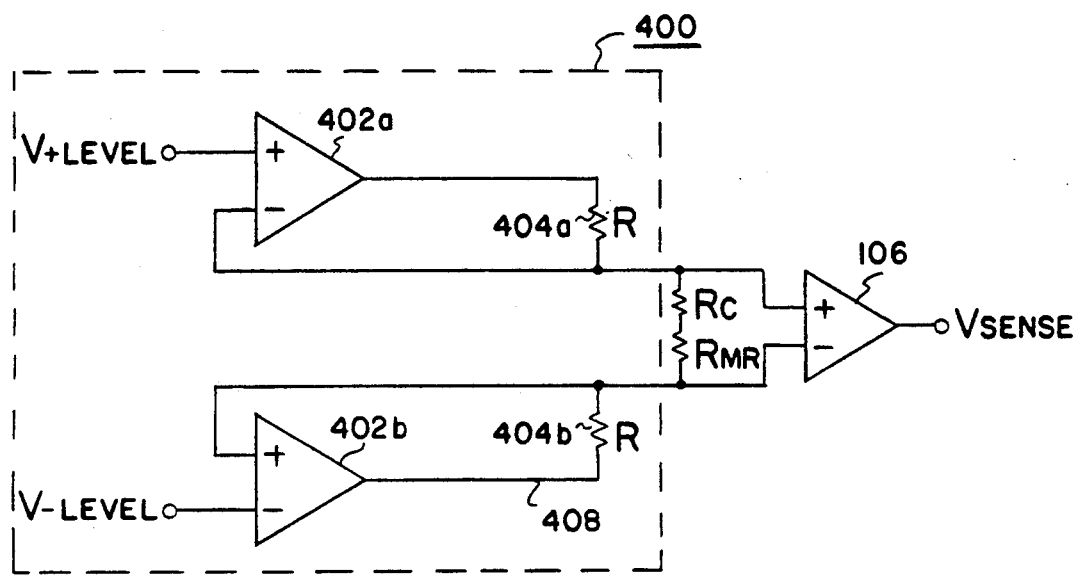
FIG. 4 illustrates a constant voltage biasing circuit using operational amplifiers.

FIG. 4 illustrates a voltage biasing circuit 400 which does not compensate for the cable drop. The voltage biasing circuit 400 is an implementation of the bias voltage source 102 in FIGS. 1 and 2. The voltage biasing circuit 400 consists of two operational amplifiers 402a and 402b, and two resistors 404a and 404b of equal value R. Resistor 404a is connected between the output and the inverting input of operational amplifier 402a, to form a unity gain buffer. Similarly, resistor 404b connected between the output and the inverting input of operational amplifier 402b to form a second unity gain buffer. The unity gain buffers are used to isolate the source voltages, $V_{+level}$ and $V_{-level}$ from the MR head 104. Both buffers are band limited to provide high ac impedance outputs required for voltage sense. The sense is performed by a differential amplifier 106.

As discussed above, it is desired to bias the MR head 104 with a constant voltage $V_{MR} = V_{+level} - V_{-level}$. However, the existence of the cable resistance $R_C$ prevents the MR head 104 from being biased at this desired level.

Figure 5:
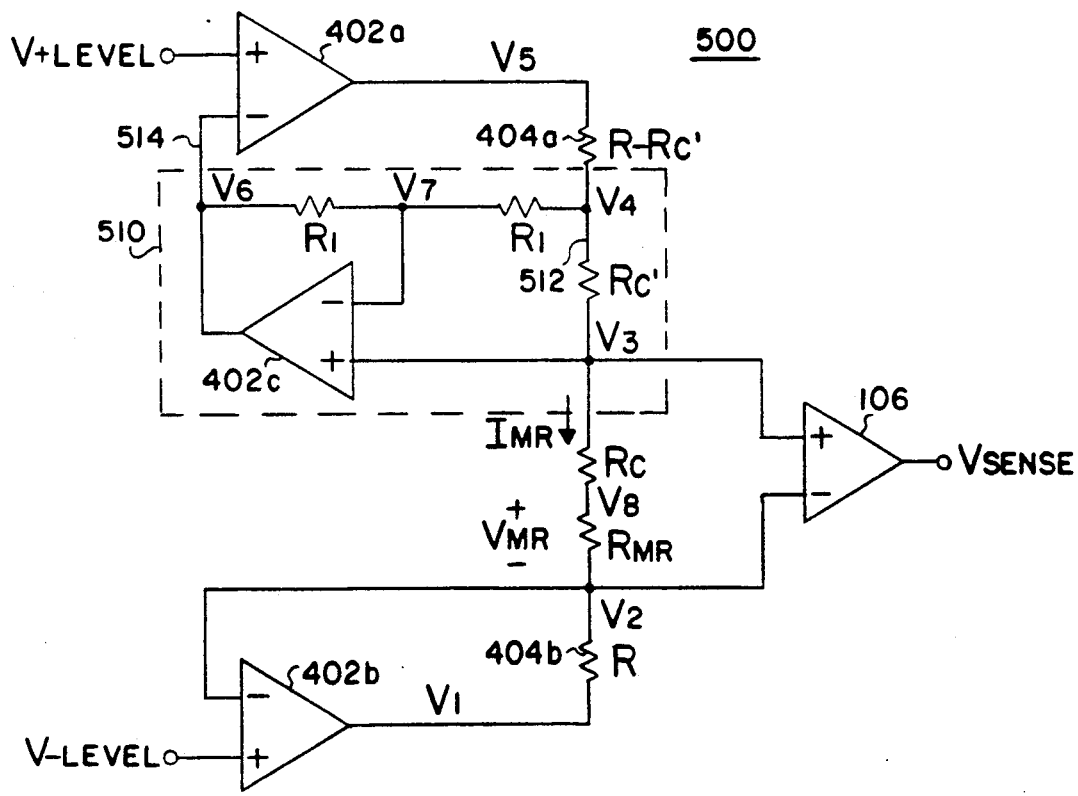
FIG. 5 illustrates the constant voltage biasing circuit of FIG. 4 with a nulling circuit to nullify the effect of the cable drop.

FIG. 5 shows a constant voltage biasing circuit 500 which compensates for the cable drop. The voltage biasing circuit 500 is similar to the voltage biasing circuit 400 in FIG. 4, but includes a nulling circuit 510 in the feedback loop between the MR head 104 and operational amplifier 402a.

The nulling circuit 510 consists of an operational amplifier 402c, two resistors of equal value R1, and a resistor of value $R'_C$. $R'_C$ is an estimate of the cable resistance $R_C$. One R1 resistor is connected between the output and the inverting input of the operational amplifier 402c. The second R1 resistor is connected between the inverting input of the operational amplifier 402c and an intermediate node 512. The $R'_C$ resistor is connected between the intermediate node 512 and the non-inverting input of the operational amplifier 402c.

Resistor 404a is changed from R in FIG. 4 to $(R - R'_C)$ in FIG. 5. This change compensates for the added resistance $R'_C$ in the path between the output of operational amplifier 402a and the MR head 104.

The voltage-drop nulling circuit 510 performs a function similar to that of the nulling voltage supply 202 in FIG. 2. In particular, the nulling circuit 510 serves to increase the voltage falling across the series combination of $R_C$ and $R_{MR}$ by an amount approximately equal to the cable drop.

Operation of nulling circuit 510 can be described as follows. The nulling circuit 510 monitors the cable drop, and generates an output signal 514 for adjusting the bias voltage which is output by the voltage biasing circuit 500. The cable drop is monitored by monitoring the voltage across $R'_C$, which is approximately equal to the cable drop. The output signal 514 is generated by the operational amplifier 402c, and the two R1 resistive elements which form a voltage divider network. The output signal 514 is connected to the inverting input of operational amplifier 402a, and serves to adjust the voltage at the output of the operational amplifier 402a by the amount necessary to null the effect of the cable drop.

The adjustment made by the nulling circuit 510 corresponds to the addition of a nulling voltage component to a constant voltage component ($V_{+level}-V_{-level}$). The nulling voltage component is approximately equal to the cable drop. The sum of the nulling voltage component and the constant voltage component is applied to the series combination of $R_C$ and $R_{MR}$. A voltage equal to the constant voltage component ($V_{+level}-V_{-level}$) falls across $R_{MR}$.

Operation of the voltage biasing circuit 500 will now be described with reference to node voltages V1 through V8 in FIG. 5. In order to simplify the description, it is assumed that perfect operational amplifiers are used, having no current flowing through the inputs. A simple dc analysis is performed, eliminating the need to consider band width limitations imposed on the three operational amplifiers.

The current which flows through $R'_C$ is the same as the current $I_{MR}$ which flows through $R_C$ and $R_{MR}$. Thus, assuming that $R'_C=R_C$, the voltage (V3−V8) across $R_C$ is equal to the voltage (V4−V3) across $R'_C$. Additionally, since V3=V7 (assuming the inputs of operational amplifier 402c are at equal voltage), the voltage (V3−V8) across $R_C$ is equal to the voltage (V4−V7) across R1. Since the current flowing through each R1 resistor is the same, the voltage across each R1 resistor is equal. Thus, one cable drop=(V3−V8)=(V4−V3)=(V4−V7)=(V7−V6).

It follows that two cable drops=(V4−V8)=(V4−V6). Therefore, V6=V8. Since V6=$V_{+level}$ (assuming the inputs of operational amplifier 402a are at equal voltage), V6=V8=$V_{+level}$. Similarly, since V2=$V_{-level}$ (assuming the inputs of operational amplifier 402b are at equal voltage), the voltage across $R_{MR}$ is $V_{MR}$=(V8−V2)=($V_{+level}-V_{-level}$). Therefore, the voltage-drop nulling circuit 510 nulls the drop in the voltage across $R_{MR}$ due to $R_C$, providing a true voltage bias across the MR head 104.

FIG. 5 illustrates a circuit implementation using a specific nulling circuit 510. In this example, the two resistances labeled R1 have the same value as each other, $R'_C$ has a value substantially equal to $R_C$ and the current through $R'_C$ is substantially equal to the current through $R_C$. In a more general case, the three above mentioned equalities are not a requirement for the circuit to work properly. However, the ratio of values of the two resistances R1 must be known, the ratio of $R'_C$ and $R_C$ must be estimated, and the ratio of the currents through $R'_C$ and $R_C$ must be known. In this more general case, the values of the above mentioned ratios are selected to provide a nulling voltage equal to the cable drop.

In a preferred embodiment, the voltage biasing circuit 500, including the nulling circuit 510, are integrated on a single chip. Matched transistors are used to implement the operational amplifiers 402a-c. It should be understood that the embodiment of the nulling circuit 510 of FIG. 5 is designed for the voltage biasing circuit 400 shown in FIG. 4. Alternate embodiments will depend on the specific voltage biasing circuit being used. It should additionally be understood that the nulling circuit 510 can be used to supply a constant voltage to any element or series of elements, and is not limited to an MR head.

While a single embodiment of the present invention has been described above, it should be understood that it has been presented by way of example only, and not limitation. Thus, the breadth and scope of the present invention should not be limited by any of the above described embodiments, but should be defined only in accordance with the following claims and their equivalents.

What is claimed is:

1. A circuit which compensates for a parasitic voltage drop by providing a constant voltage bias across an element, wherein the circuit generates an output bias voltage having a constant bias voltage component and a nulling voltage component, the circuit comprising:

a voltage biasing circuit which generates the constant bias voltage component;

a nulling circuit coupled to said voltage biasing circuit which compensates for the parasitic voltage drop by adding the nulling voltage component to the constant bias voltage component to produce the output bias voltage, said nulling circuit having, monitoring means for monitoring the parasitic voltage drop;

generating means, coupled to said monitoring means, for generating the nulling voltage component in proportion to the parasitic voltage drop; and adding means for adding the nulling voltage component to the constant bias voltage component.

2. The circuit of claim 1, wherein said nulling circuit is configured as a feedback loop coupled between the element and the voltage biasing circuit, said nulling circuit comprising an operational amplifier and a voltage divider network.

3. The circuit of claim 2, wherein said adding means provides an output signal of said nulling circuit for adjusting the output bias voltage of the circuit.

4. The circuit of claim 2, wherein said voltage divider network comprises a resistive element for monitoring the parasitic voltage drop.

5. The circuit of claim 4, wherein said resistive element has a value substantially equal to the cable resistance.

6. The circuit of claim 4, wherein the parasitic voltage drop is monitored by routing a current through said resistive element, to produce a voltage substantially equal to the cable drop.

7. The circuit of claim 6, wherein said current is substantially equal to a current flowing through the cable resistance.

8. The circuit of claim 1, wherein the element is an MR head.

9. A circuit for generating an output voltage bias having a constant bias voltage component and a nulling voltage component, wherein said circuit compensates for a drop in a voltage across an element due to a cable resistance, comprising:

a voltage biasing circuit which generates the constant bias voltage component;

a nulling circuit coupled to said voltage biasing circuit which nullifies the drop in the voltage across the element by generating the nulling voltage component, said nulling voltage circuit having, an operational amplifier having a non-inverting input, an inverting input, and an output;

a first resistive element connected between said non-inverting input and an intermediate node, said resistive element having a resistance which is an estimate of the cable resistance;

a second resistive element connected between said output and said inverting input; and a third resistive element connected between said inverting input and said intermediate node.

10. The circuit of claim 9, wherein said second resistive element and said third resistive element are of equal resistance.

11. A method for applying a constant voltage bias to an element, wherein a parasitic cable resistance exists in series with the element, the method comprising the steps of:

(a) applying an output bias voltage to the series combination of the parasitic cable resistance and the element, said output bias voltage comprising a constant bias voltage component and a nulling voltage component;

(b) nullifying the effect of a cable drop across the parasitic resistance by,
 (i) generating the nulling voltage component which is an estimate of the cable drop, using a resistive element having a resistance which is an estimate of the parasitic cable resistance; and
 (ii) adding the nulling voltage component to the constant bias voltage component to adjust the output bias voltage.

12. The method of claim 11, wherein said nulling voltage component is generated by passing a current through said resistive element, said current being substantially equal in value to a current passing through the element.

* * * * *